United States Patent [19]
Yellamilli

[11] Patent Number: 5,148,052
[45] Date of Patent: Sep. 15, 1992

[54] RECIRCULATING TRANSPARENT LATCH EMPLOYING A MULTIPLEXING CIRCUIT

[75] Inventor: Krishna M. Yellamilli, San Jose, Calif.

[73] Assignee: Intel Corporation, Santa Clara, Calif.

[21] Appl. No.: 774,795

[22] Filed: Oct. 10, 1991

[51] Int. Cl.$^5$ .................. H03K 3/26; H03K 11/687
[52] U.S. Cl. .................. 307/279; 307/272.1; 307/571; 307/242; 307/582; 307/585
[58] Field of Search .......... 307/279, 272.1, 272.3, 307/571, 242, 443, 582.3, 585

[56] References Cited

U.S. PATENT DOCUMENTS

| | | | |
|---|---|---|---|
| 4,819,208 | 4/1989 | Nakabayashi et al. | 307/242 |
| 4,940,904 | 7/1990 | Lin | 307/443 |
| 4,970,407 | 11/1990 | Patchen | 307/279 |
| 5,001,368 | 3/1991 | Cliff et al. | 307/443 |
| 5,036,221 | 7/1991 | Brucculeri et al. | 307/443 |

FOREIGN PATENT DOCUMENTS 8303326 9/1983 European Pat. Off. ............ 307/583

*Primary Examiner*—Stanley D. Miller
*Assistant Examiner*—Margaret Rose Wambach
*Attorney, Agent, or Firm*—Blakely, Sokoloff, Taylor & Zafman

[57] ABSTRACT

A data latching circuit includes a standard clock qualified transparent latch cell which receives an input data signal and an enable signal. The input data signal is also asserted at the input of a first transistor gate circuit which is controlled by the enable signal. The output of the transparent latch is asserted at the input of a second transistor gate circuit which is controlled by an inverted enable signal. The outputs of the two transistor gate circuits, only one of which is active at any time, are combined and buffered for output.

11 Claims, 2 Drawing Sheets

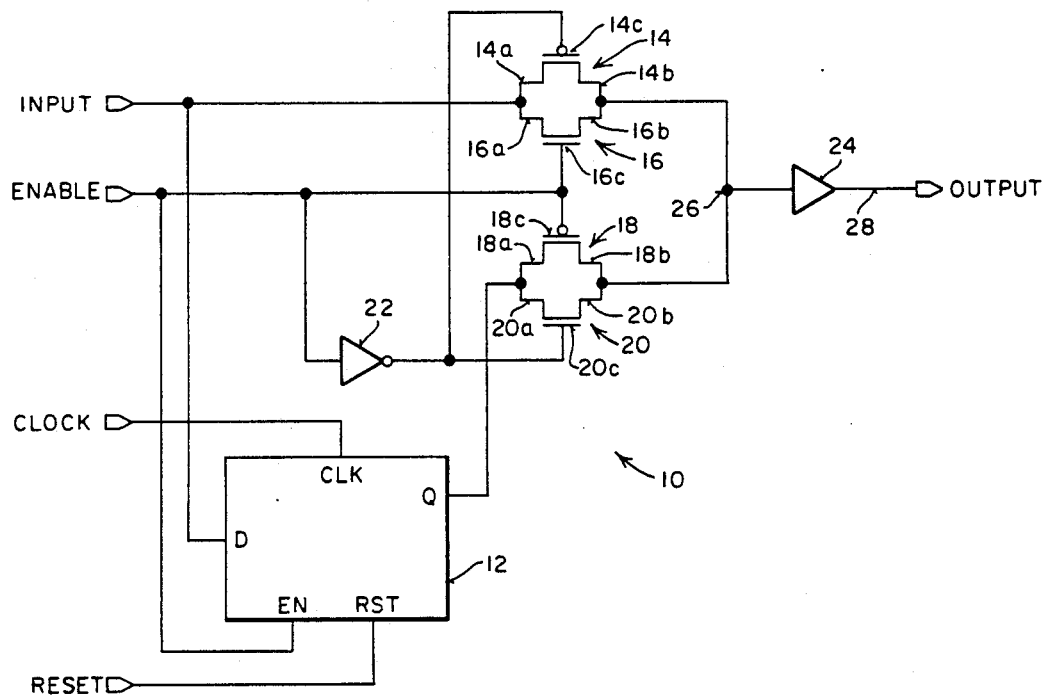
FIG_1
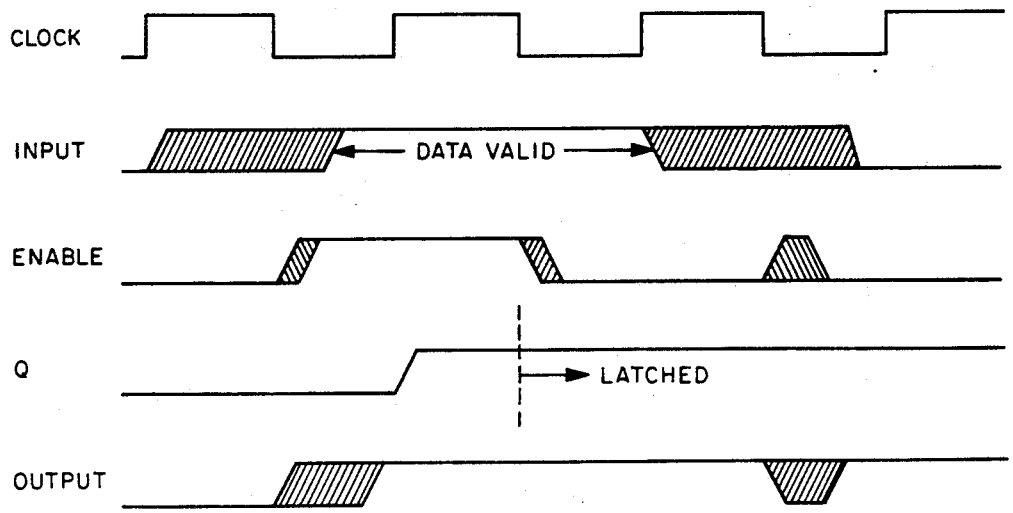
FIG_2

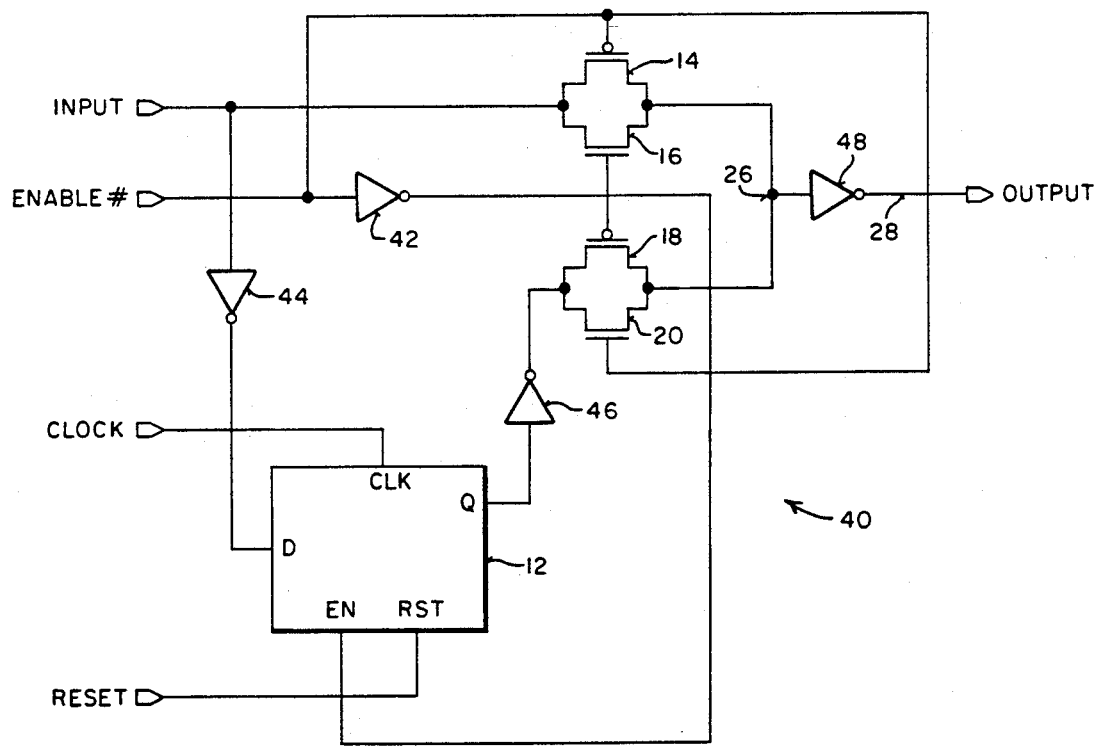
FIG_3

RECIRCULATING TRANSPARENT LATCH EMPLOYING A MULTIPLEXING CIRCUIT

FIELD OF THE INVENTION

This invention relates to the field of digital circuitry, and particularly, to a data latching circuit.

BACKGROUND OF THE INVENTION

Two types of data latches are commonly used in digital data processing systems. In a "transparent" latch, the output follows the corresponding input signal while the latch is enabled. When the enable signal is removed, the data then presented at the input terminal is latched, and the output terminal remains in such state regardless of further transitions at the input terminal until the latch is again enabled.

Another common latching circuit is an edge-triggered latch, also commonly known as a D-type flip-flop. In an edge-triggered latch, data at the input terminal is clocked to the output terminal on successive transitions, usually the falling edge, of a clock or strobe signal.

It is a common situation in many digital processing systems for data signals to be unstable for some initial period of time following the leading edge of a data strobe. If the data strobe is used as the enable signal for a transparent latch, the output signal will be initially unstable since the output signal follows the input signal. As long as the data is valid at the falling edge of the data strobe, a transparent latch will retain valid data. An edge triggered latch using the falling edge of the data strobe will always capture valid data and will be free of transients caused by the initial instability of the input signal. However, valid data from such an edge-triggered latch is not available until the falling edge of the data strobe, and this may not be acceptable to meet timing constraints of the system. In such situations, use of a transparent latch is advantageous since valid output data is available sooner.

In some applications, it is desirable to qualify a transparent latch with a clock signal which acts as an additional enable signal. Thus, the latch is enabled only when both the enable signal and the clock signal are high. With this arrangement, valid data is unavailable before the leading edge of the clock signal, and again this may be inconsistent with timing constraints of the system.

SUMMARY OF THE INVENTION

One of the objects of the present invention is to provide a latching circuit whereby data is latched by a clock qualified transparent latch, but wherein valid data is available before the leading edge of the clock signal.

It is another object of the present invention to provide an optimized recirculating latch utilizing a standard transparent latch cell and a minimum of additional circuitry.

To achieve these and other objects, the present invention comprises a standard clock qualified transparent latch cell which receives an input data signal and an enable signal. The input data signal is also asserted at the input of a first transistor gate circuit which is controlled by the enable signal. The output of the transparent latch is asserted at the input of a second transistor gate circuit which is controlled by an inverted enable signal. The outputs of the two transistor gate circuits, only one of which is active at any time, are combined and buffered for output.

BRIEF DESCRIPTION OF THE DRAWINGS

FIG. 1 is a schematic diagram of a recirculating latch circuit according to the present invention.

FIG. 2 is a timing diagram illustrating the operation of the circuit in FIG. 1.

FIG. 3 is a schematic diagram of an alternative recirculating latch circuit according to the present invention.

DETAILED DESCRIPTION OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as to not obscure the description of the present invention with unnecessary detail.

A first embodiment of a recirculating latch 10 according to the present invention is illustration in FIG. 1. A data input signal is asserted at the D input terminal of transparent latch 12. Latch 12 is preferably a standard cell for a conventional transparent or half latch. Latch 12 also receives an enable signal at its EN input terminal. The enable signal may be noisy at its transitions, but is guaranteed to be clean for a nominal period of time.

Latch 12 additionally receives a clock signal at is CLK input terminal. The nature of the clock signal depends upon the particular application in which the recirculating latch 10 is used. In an exemplary application for latching signals within a microprocessor system, the clock signal is preferably one of the microprocessor phase clock signals.

A reset signal may be applied to the RST terminal of latch 12 for forcing the Q output low as is well known.

The input data signal is also asserted at conducting terminals 14a and 16a of transistors 14 and 16, respectively. The opposite conducting terminals 14b and 16b of transistors 14 and 16 are coupled to node 26.

The Q output of latch 12 is coupled to conducting terminals 18a and 20a of transistors 18 and 20, respectively. The opposite conducting terminals 18b and 20b of transistors 18 and 20 are coupled to node 26, together with terminals 14b and 16b as mentioned above. Node 26 is coupled to the input of non-inverting buffer 24, the output of which constitutes the output of recirculating latch 10.

The enable input is asserted at non-inverting gate terminal 16c of transistor 16 and inverting gate terminal 18c of transistor 18. An inverted enable signal is provided by inverter 22 and is asserted at non-inverting gate terminal 20c of transistor 20 and inverting gate terminal 14c of transistor 14. It will be recognized that when the enable signal is high, transistors 14 and 16 are turned on and transistors 18 and 20 are turned off. Conversely, when the enable signal is low, transistors 18 and 20 are turned on and transistors 14 and 16 are turned off. The state of the enable signal thus selects between the input data signal and the Q output of latch 12, the former being asserted at the input of buffer 24 when the enable signal is high and the latter when the enable signal is low.

Referring now to the timing diagram of FIG. 2, the overall operation of recirculating latch 10 will be better understood. As indicated above, the timing characteristics of the clock signal applied to the CLK input of transparent latch 12 will depend on the particular application for latch 10, but in a microprocessor system this will preferably be one of the phase clock signals. FIG. 2 illustrates the operation of latch 10 when the input data signal is sensed at a high level; however, it will be understood that operation of the circuit is identical if the input data signal is sensed at a low level. Outside of the data valid region, the state of the input data signal is arbitrary.

The enable signal is approximately synchronous with the clock signal, but may be subject to indeterminate delays and may be noisy at the transistions. However, the enable signal is known to be stable for a significant portion of the clock cycle.

When the enable signal first goes high, the clock signal is low and thus the Q output of transparent latch 12 remains at the state previously latched. In FIG. 2, the Q output of latch 12 is shown in a reset condition prior to assertion of the enable signal. When the clock signal and the enable signal are both high, latch 12 is enabled so that the Q output tracks the input data signal, which is high in FIG. 2.

When the clock signal next goes low, the Q output of latch 12 is again latched at the current state of the input data signal. Since this transition is near the middle of the data valid region, it is assured that valid data will be latched. Any glitches in the enable signal that follow will not affect the state of latch 12.

While the enable signal is high, transistors 14 and 16 are conducting and the output signal 28 is driven directly by the input data signal so that valid data is available at the output prior to the rising edge of the clock signal as desired. When the enable signal goes low, transistors 18 and 20 are turned on, thereby applying the Q output of latch 12 at buffer 24. By the time the enable signal goes low, valid data is latched in latch 12 and thus output 28 will continue to reflect valid data until the enable signal goes back high or until latch 12 is reset.

If glitches should appear on the enable signal at subsequent clock transitions as illustrated in FIG. 2, the output signal 28 may also glitch as it toggles between the output of latch 12 and the input data signal. However, when the enable signal settles out, output signal 28 "recirculates" to its previous value which is held by the Q output of latch 12. The Q output is unaffected by the glitch on the enable signal since the latch is disabled at the time of the glitch by the low state of the clock signal.

Referring now to FIG. 3, a second embodiment of a recirculating latch 40 according to the present invention is illustrated. Latch 40 is essentially the same as latch 10 previously described, but with certain logic inversions as described below.

In the case of latch 40, a low going enable signal (ENABLE#) is provided which is inverted to positive logic by inverter 42. Operation of transistors 14-20 is thus identical to the previously described embodiment.

The input data signal is inverted by inverter 44 prior to assertion at the D input of latch 12. The Q output of latch 12 is then inverted by inverter 46, whose output, having the same sense as the input data signal, is asserted at terminals 18c and 20c of transistors 18 and 20, respectively. Output inverter 48 is substituted for non-inverting output buffer 24 so that the output of recirculating latch 40 is inverted with respect to the input data signal.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

I claim:

1. A data latching circuit comprising:
   a transparent latch circuit having an input signal and an output signal and that is responsive to a control signal so that the output signal tracks the input signal when the control signal is asserted and latches the output signal when the control signal is deasserted;
   a multiplexing circuit having a first mux input coupled to the input signal of the transparent latch circuit and a second mux input coupled to the output signal of the transparent latch circuit, the multiplexing circuit further receiving the control signal for selectively coupling the first mux input to a mux output when the control signal is asserted and the second mux input to the mux output when the control signal is deasserted.

2. The data latching circuit of claim 1 wherein the transparent latch circuit is clock qualified with a clock signal such that the output signal tracks the input signal when both the control signal and the clock signal are asserted and latches the output signal when either of the control signal and the clock signal are deasserted.

3. A data latching circuit comprising:
   a transparent latch circuit having an input signal and an output signal and that is responsive to a control signal so that the output signal tracks the input signal when the control signal is asserted and latches the output signal when the control signal is deasserted;
   a multiplexing circuit having a first mux input coupled to the input signal of the transparent latch circuit and a second mux input coupled to the output signal of the transparent latch circuit, the multiplexing circuit further having a selection signal for selectively coupling one of the first and second mux inputs to a mux output, wherein the multiplexing circuit comprises a first pair of complementary transistors having respective first terminals coupled to the first mux input and a second pair of complementary transistors having respective first terminals coupled to the second mux input and wherein respective second terminals of the first and second pairs of complementary transistors are all coupled to the mux output.

4. The data latching circuit of claim 3 further comprising a buffer circuit coupled to the mux output.

5. The data latching circuit of claim 3 wherein the control signal and the selection signal are the same.

6. The data latching circuit of claim 3 wherein gate terminals of each of the first and second pairs of complementary transistors are coupled to the selection signal.

7. The data latching circuit of claim 6 wherein the selection signal is coupled to opposing ones of the first and second pairs of complementary transistors through an inverter.

8. A data latching circuit comprising a transparent latch circuit having an input signal and an output signal and that is responsive to a control signal so that the output signal tracks the input signal when the control signal is asserted and latches the output signal when the control signal is deasserted;
- a first pair of complementary transistors having respective first terminals coupled to the input signal of the transparent latch, respective second terminals, and respective gate terminals coupled to the control signal;
- a second pair of complementary transistors having respective first terminals coupled to the output signal of the transparent latch, respective second terminals, and respective gate terminals coupled to the control signal;
- an inverter for coupling opposing ones of the respective gate terminals of the first and second pairs of complementary transistors to the control signal; and
- an output buffer having an input terminal coupled to the respective second terminals of both of the first and second pairs of complementary transistors.

9. The data latching circuit of claim 8 wherein the transparent latch circuit is clock qualified with a clock signal such that the output signal tracks the input signal when both the control signal and the clock signal are asserted and latches the output signal when either of the control signal and the clock signal are deasserted.

10. The data latching circuit of claim 8 wherein the inverter is a first inverter, the output buffer is a second inverter and further comprising a third inverter for coupling the input signal to the transparent latch and a fourth inverter for coupling the output signal of the transparent latch circuit to the second pair of complementary transistors.

11. The data latching circuit of claim 10 wherein the transparent latch circuit is clock qualified with a clock signal such that the output signal tracks the input signal when both the control signal and the clock signal are asserted and latches the output signal when either of the control signal and the clock signal are deasserted.

* * * * *